United States Patent
Seok et al.

(10) Patent No.: US 12,191,323 B2
(45) Date of Patent: Jan. 7, 2025

(54) DISPLAY DEVICE MANUFACTURING APPARATUS AND METHOD

(71) Applicant: Samsung Display Co., Ltd., Yongin-si (KR)

(72) Inventors: Kihwan Seok, Yongin-si (KR); Hoonchul Ryoo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 437 days.

(21) Appl. No.: 17/205,509

(22) Filed: Mar. 18, 2021

(65) Prior Publication Data
US 2022/0052082 A1    Feb. 17, 2022

(30) Foreign Application Priority Data

Aug. 14, 2020    (KR) .......................... 10-2020-0102715

(51) Int. Cl.
*H01L 27/12*    (2006.01)

(52) U.S. Cl.
CPC ...... *H01L 27/1285* (2013.01); *H01L 27/1262* (2013.01); *H01L 27/1296* (2013.01)

(58) Field of Classification Search
CPC ............ H01L 27/1285; H01L 27/1262; H01L 27/1296; H01L 21/67115; H01L 22/12;
(Continued)

(56) References Cited

U.S. PATENT DOCUMENTS 5,994,164 A  *  11/1999  Fonash ............... H01L 21/2022
                                                               438/162
6,278,132 B1     8/2001  Yamazaki et al.
(Continued)

FOREIGN PATENT DOCUMENTS

JP            9102468    *   4/1997
JP          H10-79517        3/1998
(Continued)

OTHER PUBLICATIONS

JP 11-121378 ("MTD '378"). (Year: 1999).*
(Continued)

*Primary Examiner* — Edward Chin
(74) *Attorney, Agent, or Firm* — KILE PARK REED & HOUTTEMAN PLLC

(57) ABSTRACT

A display device manufacturing method includes annealing a display substrate by irradiating a laser to the display substrate in different energy values, measuring a transmittance of the annealed display substrate, and determining an optimal crystallization value of the display substrate based on the transmittance, wherein the determining of the optimal crystallization value includes calculating an absorbance of the display substrate for each energy value of the laser based on the transmittance, calculating a band gap energy of the annealed display substrate for each energy value of the laser based on the absorbance, and determining an energy value of the laser corresponding to a minimum value of the band gap energy as the optimal crystallization value. Also provided is a display device manufacturing apparatus that may implement the manufacturing method.

14 Claims, 11 Drawing Sheets

(58) Field of Classification Search
CPC ............. H01L 22/26; H01L 27/1222; H01L 29/78651; G01N 21/8422
See application file for complete search history.

(56) References Cited

U.S. PATENT DOCUMENTS

| | | | | |
|---|---|---|---|---|
| 6,744,008 | B1* | 6/2004 | Kasahara | H01L 21/02422 219/121.65 |
| 7,964,417 | B2 | 6/2011 | Lee | |
| 9,257,288 | B2 | 2/2016 | Ivan et al. | |
| 2001/0038105 | A1* | 11/2001 | Wada | H01L 22/12 257/E21.53 |
| 2002/0052069 | A1* | 5/2002 | Jiroku | H01L 21/02488 438/150 |
| 2003/0040130 | A1* | 2/2003 | Mayur | H01L 21/268 257/E21.336 |
| 2003/0218171 | A1* | 11/2003 | Isobe | H01L 27/12 438/149 |
| 2004/0203219 | A1* | 10/2004 | Kasahara | H01L 21/0242 257/E21.134 |
| 2005/0139830 | A1* | 6/2005 | Takeda | H01L 21/2026 257/66 |
| 2005/0142701 | A1* | 6/2005 | Yamaguchi | H01L 27/1285 438/151 |
| 2007/0010104 | A1* | 1/2007 | Im | C30B 35/00 438/795 |
| 2012/0164801 | A1* | 6/2012 | Yamazaki | H01L 27/1214 257/E21.409 |
| 2013/0049004 | A1* | 2/2013 | Sugawara | H01L 27/1281 257/E27.06 |
| 2014/0231813 | A1* | 8/2014 | Oda | H01L 21/268 257/66 |
| 2014/0329343 | A1* | 11/2014 | Ivan | H01L 22/12 438/16 |
| 2016/0233116 | A1* | 8/2016 | Van Der Wilt | G02B 21/0092 |
| 2018/0108847 | A1* | 4/2018 | Suzuki | C07D 405/10 |
| 2019/0267240 | A1* | 8/2019 | Ohmori | H01L 22/12 |
| 2019/0351623 | A1* | 11/2019 | Kihara | B32B 7/027 |
| 2020/0030515 | A1* | 1/2020 | Merchant | A61B 5/02427 |

FOREIGN PATENT DOCUMENTS

| | | |
|---|---|---|
| JP | 11121378 * | 4/1999 |
| JP | 2002-9012 | 1/2002 |
| JP | 3923141 B2 * | 5/2007 |
| JP | 2009-53134 | 3/2009 |
| KR | 10-0786873 | 12/2007 |
| KR | 10-2013-0095355 | 8/2013 |
| KR | 10-2105075 | 4/2020 |

OTHER PUBLICATIONS

JP 09-102468 ("MTD '468"). (Year: 1997).*
JP200511840 (Year: 2005).*
JP-3923141-B2 (Yamazaki et al.) (Year: 2007).*
Byung Tae Ahn et al., "High-Quality Polycrystalline Silicon Film Crystallized from Amorphous Silicon Film using NiCl2 Vapor", Journal of The Electrochemical Society, Jan. 2012, pp. H29-H32, vol. 159.

* cited by examiner

FIG. 8A

| Area | FIRST LASER ENERGY VALUE ($E_{l,a}$) | FIRST BAND GAP ENERGY ($E_{g,a}$) |
|---|---|---|
| ① | $E_{l,a}$ 1 | $E_{g,a}$ 1 |
| ② | $E_{l,a}$ 2 | $E_{g,a}$ 2 |
| ③ | $E_{l,a}$ 3 | $E_{g,a}$ 3 |
| ④ | $E_{l,a}$ 4 | $E_{g,a}$ 4 |
| ⑤ | $E_{l,a}$ 5 | $E_{g,a}$ 5 |
| ⑥ | $E_{l,a}$ 6 | $E_{g,a}$ 6 |
| ⑦ | $E_{l,a}$ 7 | $E_{g,a}$ 7 |
| ⑧ | $E_{l,a}$ 8 | $E_{g,a}$ 8 |
| ⑨ | $E_{l,a}$ 9 | $E_{g,a}$ 9 |
| ⑩ | $E_{l,a}$ 10 | $E_{g,a}$ 10 |

FIG. 8B

| Area | SECOND LASER ENERGY VALUE($E_{l,b}$) | SECOND BAND GAP ENERGY($E_{g,b}$) |
|---|---|---|
| ① | $E_{l,b}$ 1 | $E_{g,b}$ 1 |
| ② | $E_{l,b}$ 2 | $E_{g,b}$ 2 |
| ③ | $E_{l,b}$ 3 | $E_{g,b}$ 3 |
| ④ | $E_{l,b}$ 4 | $E_{g,b}$ 4 |
| ⑤ | $E_{l,b}$ 5 | $E_{g,b}$ 5 |
| ⑥ | $E_{l,b}$ 6 | $E_{g,b}$ 6 |
| ⑦ | $E_{l,b}$ 7 | $E_{g,b}$ 7 |
| ⑧ | $E_{l,b}$ 8 | $E_{g,b}$ 8 |
| ⑨ | $E_{l,b}$ 9 | $E_{g,b}$ 9 |
| ⑩ | $E_{l,b}$ 10 | $E_{g,b}$ 10 |

DISPLAY DEVICE MANUFACTURING APPARATUS AND METHOD

CROSS-REFERENCE TO RELATED APPLICATIONS

This application claims priority to and the benefits of Korean Patent Application No. 10-2020-0102715 under 35 U.S.C. § 119, filed on Aug. 14, 2020, in the Korean Intellectual Property Office, the disclosure of which is incorporated by reference herein in its entirety.

BACKGROUND

1. Field

The embodiments relate to an apparatus and method for manufacturing a display device.

2. Description of Related Art

Display devices may be used in mobile devices such as smart phones, laptop computers, digital cameras, camcorders, portable information terminals, notebook computers, and tablet personal computers (PCs) or electronic devices such as desktop computers, televisions, outdoor billboards, exhibition display devices, vehicle dashboards, and head-up displays (HUDs).

A display device may include a semiconductor layer included in a thin film transistor (TFT) arranged over a substrate. The semiconductor layer may include a semiconductor material such as polycrystalline silicon. Polycrystalline silicon may be formed by crystallizing amorphous silicon.

Excimer laser annealing (ELA) may be used to crystallize amorphous silicon. The crystallinity of polycrystalline silicon may vary according to the energy of an excimer laser. Thus, research has been conducted to evaluate the crystallinity of polycrystalline silicon for different laser energy values to find the energy values of an excimer laser providing the best crystallinity of polycrystalline silicon.

SUMMARY

In conventional display device manufacturing apparatuses and methods, equipment for annealing an amorphous silicon thin film and equipment for inspecting the crystallinity of an annealed silicon thin film are not unified (not integrated with each other) but separately operated. It is impossible to inspect the crystallinity of the annealed silicon thin film in real time after annealing the amorphous silicon thin film. Conventional methods may further include a visual inspection by a human resulting in variations in quality.

The embodiments include a display device manufacturing apparatus and method that may reduce the inspection time by inspecting the crystallinity of an annealed silicon thin film immediately after annealing an amorphous silicon thin film, and reduce deviations caused by a visual inspection.

In embodiments, a display device manufacturing method may include annealing a display substrate by irradiating a laser to the display substrate in different energy values, measuring a transmittance of the annealed display substrate, and determining an optimal crystallization value of the display substrate based on the transmittance. The determining of the optimal crystallization value may include calculating an absorbance of the annealed display substrate for each energy value of the laser based on the transmittance, calculating a band gap energy of the annealed display substrate for each energy value of the laser based on the absorbance, and determining an energy value of the laser corresponding to a minimum value of the band gap energy as the optimal crystallization value.

According to an embodiment, the annealing of the display substrate and the measuring of the transmittance may be simultaneously performed.

According to an embodiment, the annealing of the display substrate may include irradiating the laser having the different energy values corresponding to a plurality of areas, respectively, of the display substrate.

According to an embodiment, the energy values of the laser may satisfy an arithmetic progression from a lowest energy value to a highest energy value.

According to an embodiment, the measuring of the transmittance may include measuring transmittances of the plurality of areas of the display substrate.

According to an embodiment, the display device manufacturing method may further include measuring a reflectance of the annealed display substrate.

According to an embodiment, the calculating of the absorbance may include calculating an absorbance for each energy value of the laser based on the transmittance and the reflectance.

According to an embodiment, the calculating of the band gap energy may be performed by using a Tauc plot based upon the absorbance.

According to an embodiment, the band gap energy may correspond to a point where a straight line extending from a linear section of the Tauc plot meets an energy axis.

According to an embodiment, the display device manufacturing method may further include dividing another display substrate into a plurality of areas, irradiating a laser having different energy values corresponding to plurality of areas, respectively, of the another display substrate, wherein a median value of the energy values of the laser may be equal to the optimal crystallization value.

According to an embodiment, a part of the energy values of the laser may decrease by predetermined energy intervals from the median value, and another part of the energy values of the laser may increase by predetermined energy intervals from the median value.

According to an embodiment, the display device manufacturing method may further include moving the display substrate.

According to an embodiment, the annealing of the display substrate and the measuring of the transmittance may be sequentially performed while the display substrate moves.

According to an embodiment, a display device manufacturing apparatus may include an irradiator that irradiates a laser to a display substrate to anneal the display substrate, the laser having different energy values; a first measurer that measures a transmittance of the display substrate; and a controller that determines an optimal crystallization value of the display substrate based on the transmittance. The controller may comprise at least one processor that calculates an absorbance of the display substrate for each energy value of the laser based on the transmittance, calculates a band gap energy of the display substrate for each energy value of the laser based on the absorbance, and determines an energy value of the laser corresponding to a minimum value of the band gap energy as the optimal crystallization value.

According to an embodiment, the display device manufacturing apparatus may further include a second measurer that measures a reflectance of the display substrate.

According to an embodiment, the controller may calculate the absorbance of the display substrate based on the transmittance and the reflectance.

According to an embodiment, the display substrate may include a plurality of areas, and the irradiator may irradiate the laser having the different energy values corresponding to the plurality of areas, respectively.

According to an embodiment, the controller may calculate the band gap energy by using a Tauc plot based upon the absorbance.

According to an embodiment, the display device manufacturing apparatus may further include a mover that moves the display substrate in a preset direction.

Other aspects, features, and advantages will become apparent from the following detailed description, the appended claims, and the accompanying drawings.

These features of the embodiments may be implemented by using systems, methods, computer programs, or any combinations of systems, methods, and computer programs.

BRIEF DESCRIPTION OF THE DRAWINGS

The above and other aspects, features, and advantages of embodiments will be more apparent from the following description taken in conjunction with the accompanying drawings, in which:

FIGS. 8A and 8B are tables illustrating the band gap energy corresponding to energy values of laser energy calculated by a display device manufacturing method according to an embodiment.

DETAILED DESCRIPTION OF THE EMBODIMENTS

Figure 1A:
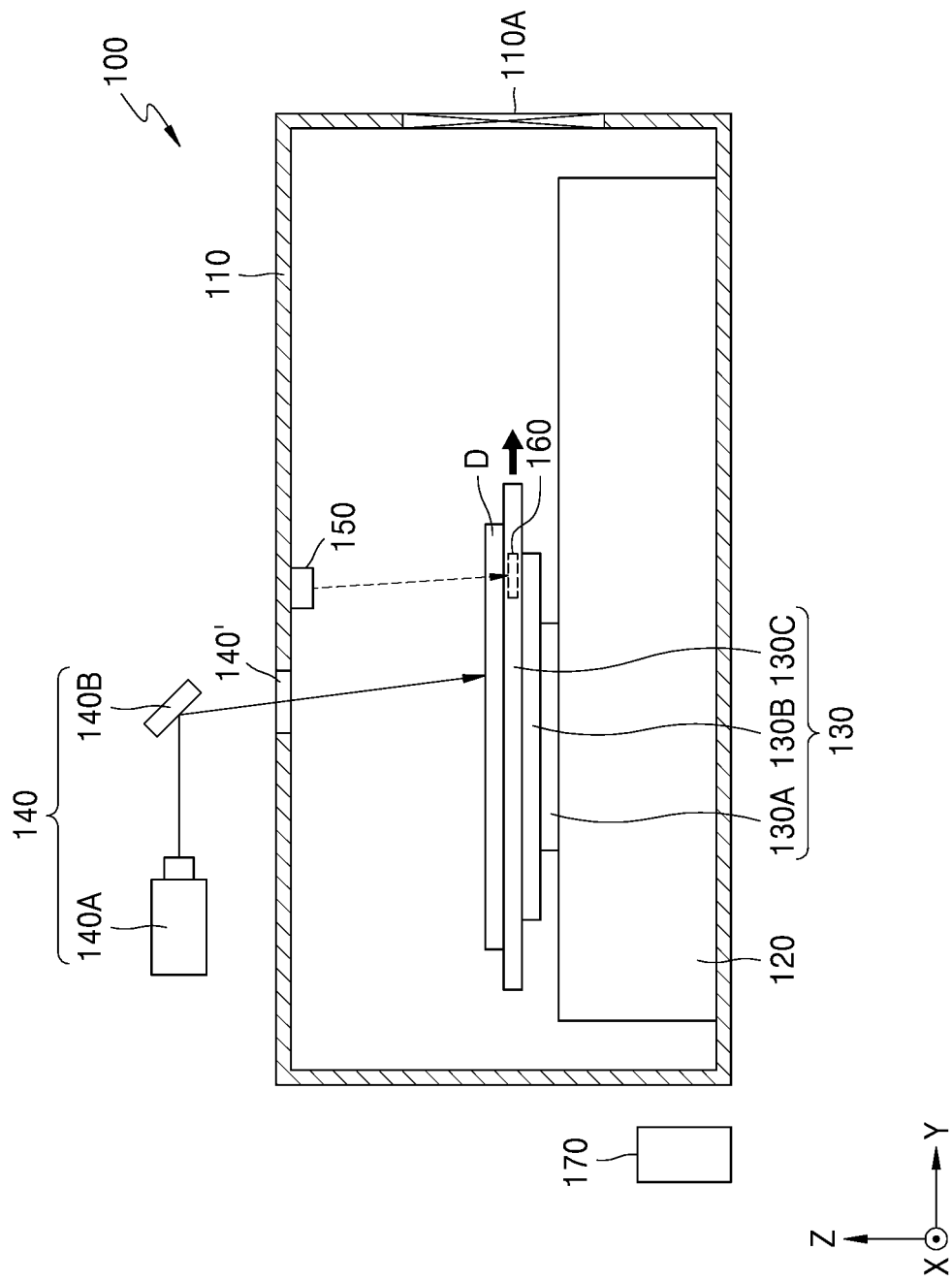
FIG. 1A is a schematic side view illustrating a display device manufacturing apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. Throughout the disclosure, the expression "at least one of a, b and c" indicates only a, only b, only c, both a and b, both a and c, both b and c, all of a, b, and c, or variations thereof.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of elements in the drawings may be exaggerated or reduced for convenience of description. For example, because sizes and thicknesses of elements in the drawings are arbitrarily illustrated for convenience of description, the disclosure is not limited thereto.

When an embodiment may be implemented differently, a particular process order may be performed differently from the described order. For example, two consecutively described processes may be performed substantially at the same time or performed in an order opposite to the described order.

As used herein, "A and/or B" represents the case of A, B, or A and B. Also, "at least one of A and B" represents the case of A, B, or A and B.

It will be further understood that, when layers, regions, or components are referred to as being connected to each other, they may be directly connected to each other or indirectly connected to each other with intervening layers, regions, or components therebetween. For example, when layers, regions, or components are referred to as being electrically connected to each other, they may be directly electrically connected to each other or indirectly electrically connected to each other with intervening layers, regions, or components therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Further, in the specification, the phrase "in a plan view" means when an object portion is viewed from above, and the phrase "in a cross-sectional view" means when a cross-section taken by vertically cutting an object portion is viewed from the side.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 80%, 5% of the stated value.

In the specifications when steps are performed "simultaneously" they are performed substantially at the same time or within a short time frame of each other, or there is a substantial overlap in the time that the steps are performed.

As the description allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a redundant description thereof is omitted.

Figure 1B:
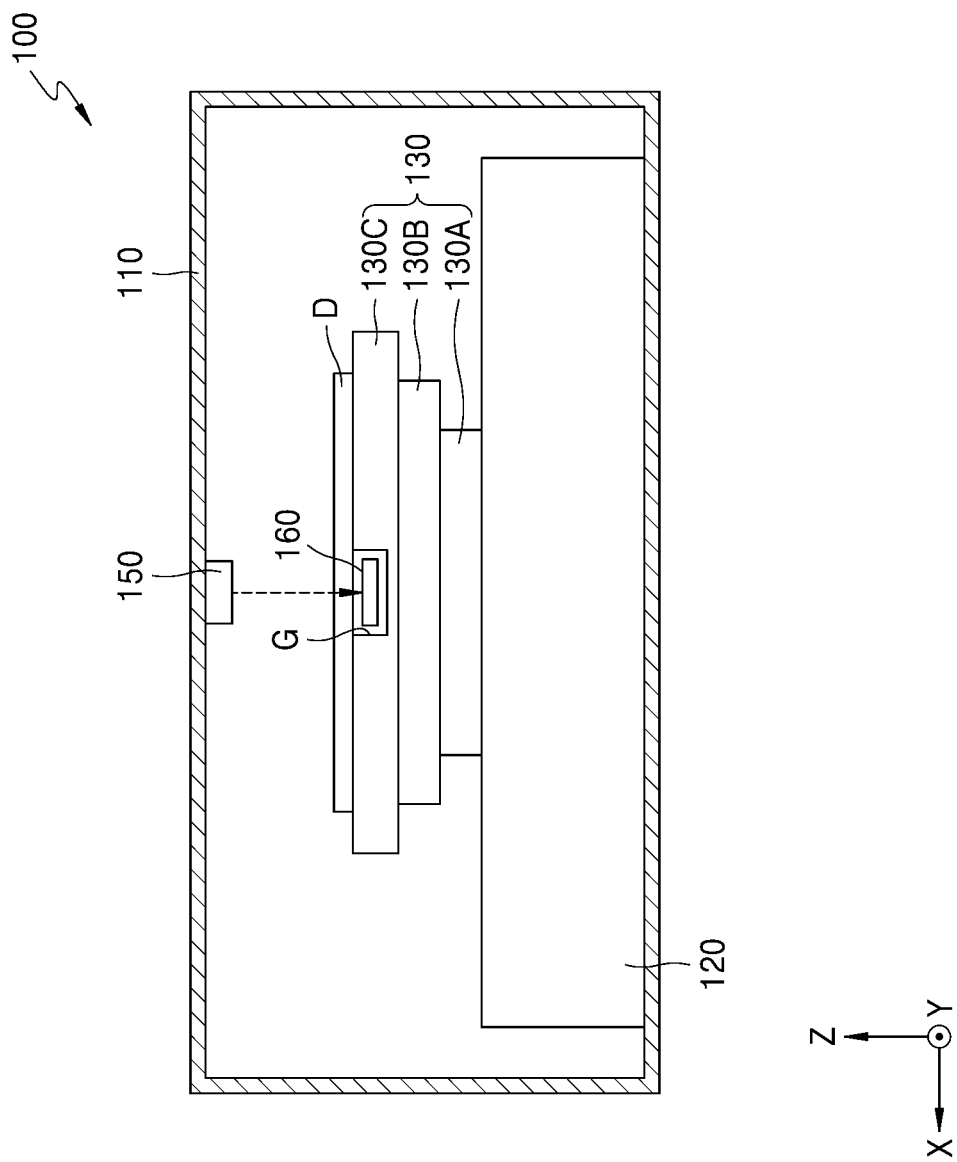
FIG. 1B is a schematic front view illustrating a display device manufacturing apparatus according to an embodiment.
Figure 2:
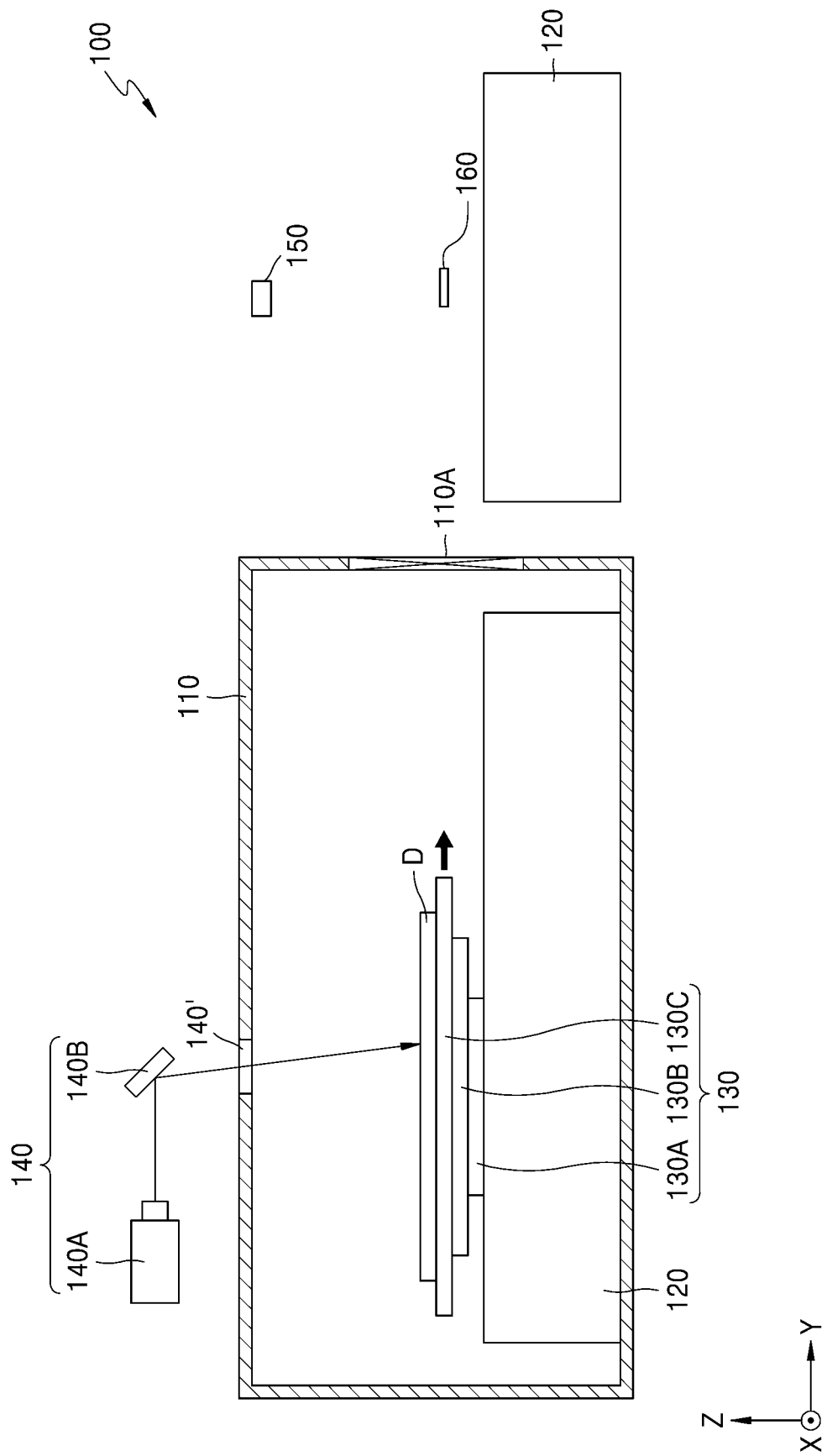
FIG. 2 is a schematic side view illustrating a display device manufacturing apparatus according to another embodiment.
Figure 3:
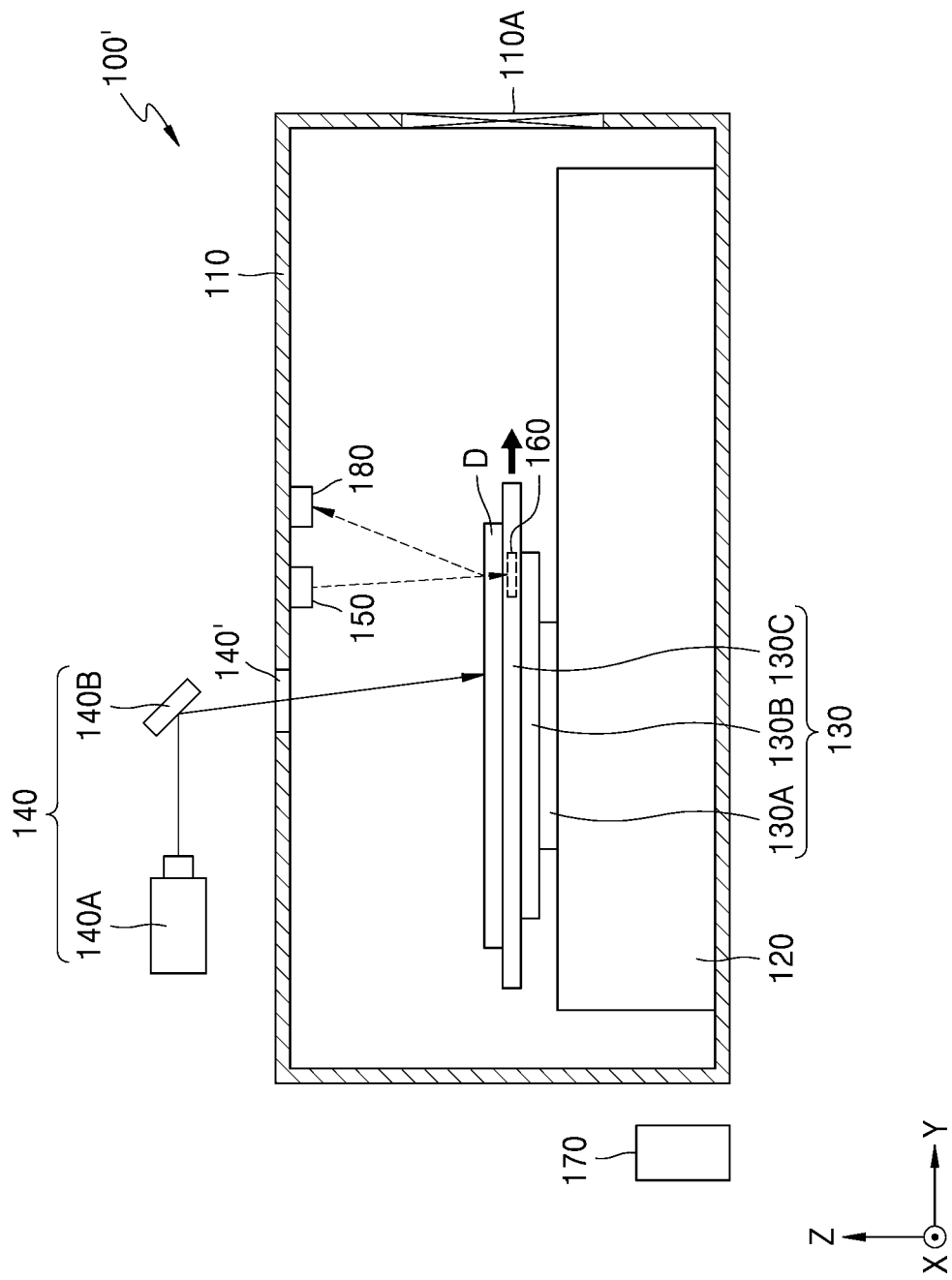
FIG. 3 is a schematic side view illustrating a display device manufacturing apparatus according to another embodiment.
Figure 4:
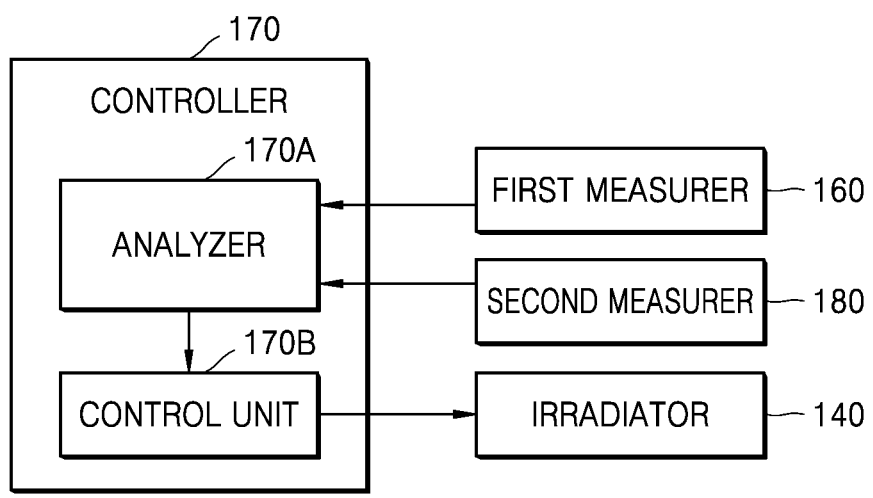
FIG. 4 is a block diagram illustrating a display device manufacturing apparatus according to an embodiment.

FIG. 1A is a schematic side view illustrating a display device manufacturing apparatus according to an embodiment, and FIG. 1B is a front view schematically illustrating a display device manufacturing apparatus according to an embodiment. FIG. 2 is a schematic side view schematically illustrating a display device manufacturing apparatus according to an embodiment, and FIG. 3 is a schematic side view illustrating a display device manufacturing apparatus according to an embodiment. FIG. 4 is a block diagram schematically illustrating a display device manufacturing apparatus according to an embodiment. FIGS. 2 and 3 may correspond to modified embodiments of FIG. 1A.

Referring to FIG. 1A, a display device manufacturing apparatus 100 may include a chamber 110, a support 120, a mover 130, an irradiator 140, a light emitter 150, a first measurer 160, and a controller 170. The irradiator 140, the light emitter 150, the first measurer 160, and the controller 170 may be fixed (or attached to a fixed location) in the chamber 110 through a fixer (not illustrated) or may be fixed (or attached) to the support 120.

The chamber 110 may have a space inside it, and a portion of the chamber 110 may be formed to be an opening. A gate valve 110A may be installed at the opening of the chamber 110 to selectively open/close the opening of the chamber 110. Although FIG. 1A illustrates only one gate valve 110A, the chamber 110 may have one or more gate valves 110A.

The chamber 110 may include a transmission window 140'. Various equipment arranged outside the chamber 110 may process the surface of a display substrate D located inside the chamber 110 or acquire the transmittance and reflectance of the display substrate D through the transmission window 140'. The transmission window 140' may function as a medium connecting the outside to the inside of the chamber 110. The transmission window 140' may be comprised of glass or acrylic. Although only one transmission window 140' is illustrated in FIG. 1A, multiple transmission windows 140' may be included.

The support 120 may be arranged inside the chamber 110. The support 120 may support the mover 130 to which the display substrate D may be attached. The support 120 may include a rail, and the mover 130 may move along the rail. For example, a granite surface plate may be used as the support 120. As another example, the support 120 may be formed of (made of) a metal, a porous material, or other materials.

The mover 130 may be arranged on the support 120. The mover 130 may include a first mover 130A, a second mover 130B, and a third mover 130C. The first mover 130A may be connected to the support 120, and the display substrate D may be attached to the third mover 130C. The second mover 130B may connect the first mover 130A to the third mover 130C. The first mover 130A, the second mover 130B, and the third mover 130C may be integrally formed.

The mover 130 may move the display substrate D in the Y direction (a preset direction). The mover 130 may move along a rail formed (or installed) in the support 120. Through the rail, the mover 130 may move in a straight line without inclining (or tilting).

The mover 130 may include a linear motor system (LMS) magnet (not illustrated) and a magnetic material (not illustrated). A linear motor may be configured by combining an LMS magnet and a magnetic material, and the mover 130 may be transferred in the Y direction by the linear motor. For example, the magnetic material may include a coil. When the mover 130 moves along the rail, the mover 130 may move (or be driven) through a magnetic levitation wireless charging system. The mover 130 may include a posture adjuster (not illustrated) for changing the position of the display substrate D or finely adjusting the position of the mover 130 itself.

The display substrate D attached to the mover 130 may be a display device or may be a portion of a display device. For example, the display substrate D may include an insulating layer, a semiconductor layer, an amorphous silicon thin film, and/or the like.

The irradiator 140 may include a laser light source unit 140A and a mirror 140B. The irradiator 140 may be arranged outside the chamber 110 and may irradiate a laser to the surface of the display substrate D through the transmission window 140'. This may be to prevent malfunction and damage to the irradiator 140 when the inside of the chamber 110 is maintained in a high-vacuum state. The irradiator 140 may be spaced apart from the upper surface of the display substrate D and may irradiate a laser toward the upper surface of the display substrate D. The irradiator 140 may irradiate a laser to a local area of the upper surface of the display substrate D.

The laser light source unit 140A may generate and output a laser. The laser light source unit 140A may adjust the frequency at which the laser is emitted and/or the intensity of the laser. The laser light source unit 140A may adjust the energy value of the laser and may generate and output a laser having multiple energy values. The laser generated and output by the laser light source unit 140A may be an excimer laser.

The laser output from the laser light source unit 140A may reach the mirror 140B. The propagation direction of the laser may be changed through the mirror 140B. For example, the angle at which the laser is reflected may be changed by adjusting the angle of the mirror 140B, to change the propagation direction of the laser. The position at which the laser is to be irradiated to the surface of the display substrate D may be adjusted by adjusting the propagation direction of the laser through the mirror 140B. The mirror 140B may be rotated when the angle of the mirror 140B is adjusted. Although one mirror 140B is illustrated in FIG. 1A, one or more mirrors 140B may be included therein.

Also, the irradiator 140 may include lenses in addition to the mirror 140B. The laser output from the laser light source unit 140A may propagate through the lenses.

The irradiator 140 may irradiate a laser to the surface of the display substrate D to heat (or anneal) and crystallize the surface of the display substrate D. The laser may have different energy values. The display substrate D may include an amorphous silicon thin film, and a polycrystalline silicon thin film may be formed by annealing the amorphous silicon thin film through the laser irradiated to the surface of the display substrate D.

The light emitter 150 may be arranged to face the display substrate D. The light emitter 150 may be arranged to be spaced apart from the upper surface of the display substrate D. The light emitter 150 may emit light to irradiate the display substrate D. The wavelength of the light emitted from the light emitter 150 may include an ultraviolet-visible light range. For example, the wavelength of the light emitted from the light emitter 150 may be in a range of about 400 nm to about 800 nm. Although FIG. 1A illustrates that the light emitter 150 is arranged inside the chamber 110, the light emitter 150 may be arranged outside the chamber 110 like the irradiator 140. The light emitter 150 may irradiate light to the display substrate D through another transmission window formed at the chamber 110.

The first measurer 160 may be arranged under the display substrate D. For example, as illustrated in FIG. 1B, a groove G may be formed at the third mover 130C, and the first measurer 160 may be arranged in the groove G. The groove G may extend in the Y direction. The first measurer 160 may be separately fixed and may not move together with the mover 130 while the mover 130 moves in the Y direction. The first measurer 160 may be fixed (or attached) to the support 120.

A portion of the light emitted from the light emitter 150 may be transmitted through the display substrate D and may reach the first measurer 160. The first measurer 160 may measure the amount of light transmitted through the display substrate D. The first measurer 160 may measure the transmittance of the display substrate D. The light emitter 150 and the first measurer 160 used to measure the transmittance of the display substrate D may correspond to parts of an ultraviolet-visible spectrophotometer.

The crystallinity of the display substrate D may vary according to the energy value of the laser irradiated to the surface of the display substrate D, and the transmittance of the display substrate D may vary according to the crystallinity of the display substrate D. The first measurer 160 may measure the transmittance of the display substrate D for different energy values of the laser.

As illustrated in FIG. 1A, the display substrate D may be annealed by irradiating a laser to the surface of the display substrate D while moving the display substrate D in the Y direction, and the transmittance of the annealed display substrate D may be measured immediately. A process of annealing the display substrate D and a process of inspecting the crystallinity of the display substrate D by measuring the transmittance of the annealed display substrate D may be unified. For example, a process of annealing the display substrate D and a process of measuring the transmittance of the display substrate D may be simultaneously performed. The crystallinity of the annealed display substrate D may be inspected in real time after the display substrate D is annealed.

Referring to FIG. 2, the light emitter 150 and the first measurer 160 may be arranged outside the chamber 110. The support 120 may be arranged (or disposed) outside the chamber 110, and the light emitter 150 and the first measurer 160 may be fixed (or disposed) to the support 120. The mover 130 may be arranged over or on the support 120 and may move to the outside of the chamber 110 by passing through the gate valve 110A along the support 120.

The annealing process of the display substrate D may be performed inside the chamber 110, and the transmittance of the display substrate D may be measured outside the chamber 110 by moving the display substrate D. After the annealing process of the display substrate D is completed, the display substrate D may be moved to the outside of the chamber 110 and then the transmittance of the display substrate D may be measured.

Referring to FIG. 3, a display device manufacturing apparatus 100' according to another embodiment may include a second measurer 180. The second measurer 180 may be arranged to face the display substrate D. The second measurer 180 may be spaced apart from the upper surface of the display substrate D. The second measurer 180 may be arranged adjacent to the light emitter 150.

A portion of the light emitted from the light emitter 150 may be reflected from the surface of the display substrate D and may reach the second measurer 180. The second measurer 180 may measure the amount of light reflected from the surface of the display substrate D. The second measurer 180 may measure the reflectance of the display substrate D.

The crystallinity of the display substrate D may vary according to the energy value of the laser irradiated to the surface of the display substrate D, and the reflectance of the display substrate D may vary according to the crystallinity of the display substrate D. The second measurer 180 may measure the reflectance of the display substrate D for each energy value of the laser.

As illustrated in FIG. 3, the display substrate D may be annealed by irradiating a laser to the surface of the display substrate D while moving the display substrate D in the Y direction, and the transmittance and reflectance of the annealed display substrate D may be measured immediately. A process of annealing the display substrate D and a process of inspecting the crystallinity of the display substrate D by measuring the transmittance and reflectance of the annealed display substrate D may be unified. For example, a process of annealing the display substrate D, a process of measuring the transmittance of the display substrate D, and a process of measuring the reflectance of the display substrate D may be simultaneously performed. The crystallinity of the annealed display substrate D may be inspected in real time after the display substrate D is annealed.

The display device manufacturing apparatus 100' may include the light emitter 150, the first measurer 160, and the second measurer 180. The transmittance and reflectance of the annealed display substrate D may be measured. The light emitted from the light emitter 150 may be transmitted through the display substrate D, absorbed by the display substrate D, or reflected from the surface of the display substrate D. Thus, when both the transmittance and the reflectance of the display substrate D are measured, the absorbance of the display substrate D may be more accurately calculated.

Although FIG. 3 illustrates that the second measurer 180 is arranged inside the chamber 110, the second measurer 180 may be arranged outside the chamber 110 like the irradiator 140. The second measurer 180 may measure the reflectance of the display substrate D through another transmission window formed in the chamber 110.

As another example, the second measurer 180 may be arranged outside the chamber 110 like the first measurer 160 illustrated in FIG. 2. An annealing process of the display substrate D may be performed inside the chamber 110, and the reflectance of the display substrate D may be measured outside the chamber 110 by moving the display substrate D. After the annealing process of the display substrate D is completed, the display substrate D may be moved to the outside of the chamber 110 and then the reflectance of the display substrate D may be measured.

Referring to FIG. 4, the controller 170 may include an analyzer 170A and a control unit 170B. For example, the controller 170 may be a desktop personal computer (PC), a notebook computer, a tablet PC, a smart phone, or the like. The controller may include at least one processor, a memory, and/or a program execution part. Although FIG. 1A illustrates that the controller 170 is arranged outside the chamber 110, the controller 170 may also be arranged inside the chamber 110.

The analyzer 170A may receive the transmittance of the display substrate D for each energy value of the laser measured through the first measurer 160 and the reflectance of the display substrate D for each energy value of the laser measured through the second measurer 180. The second measurer 180 (as shown in FIG. 4) may be omitted in the display device manufacturing apparatus 100 as shown FIGS. 1A, 1B, and 2.

The analyzer 170A may calculate the absorbance of the display substrate D for each energy value of the laser from the received transmittance and/or reflectance. The analyzer 170A may calculate the band gap energy of the display substrate D for each energy value of the laser from the calculated absorbance using a Tauc plot (refer to FIG. 7B). The analyzer 170A may determine the energy value of the laser corresponding to the minimum value of the calculated band gap energy as an optimal crystallization value and may transmit the optimal crystallization value to the control unit 170B. The process of calculating the band gap energy by using transmittance and/or reflectance will be described in more detail below through operations S10 to S40 of FIG. 5.

The control unit 170B may transmit the optimal crystallization value to the irradiator 140. The irradiator 140 may anneal the display substrate D by irradiating, to the surface of the display substrate D, a laser having the energy value corresponding to the optimal crystallization value received from the control unit 170B. The crystallinity of the display substrate D annealed through the laser having an energy value corresponding to the optimal crystallization value may also be optimized. By optimizing crystallinity of the annealed display substrate D, a thin film transistor formed of the annealed display substrate D may also have optimized or desirable electron mobility and stability against light irradiation.

Figure 5:
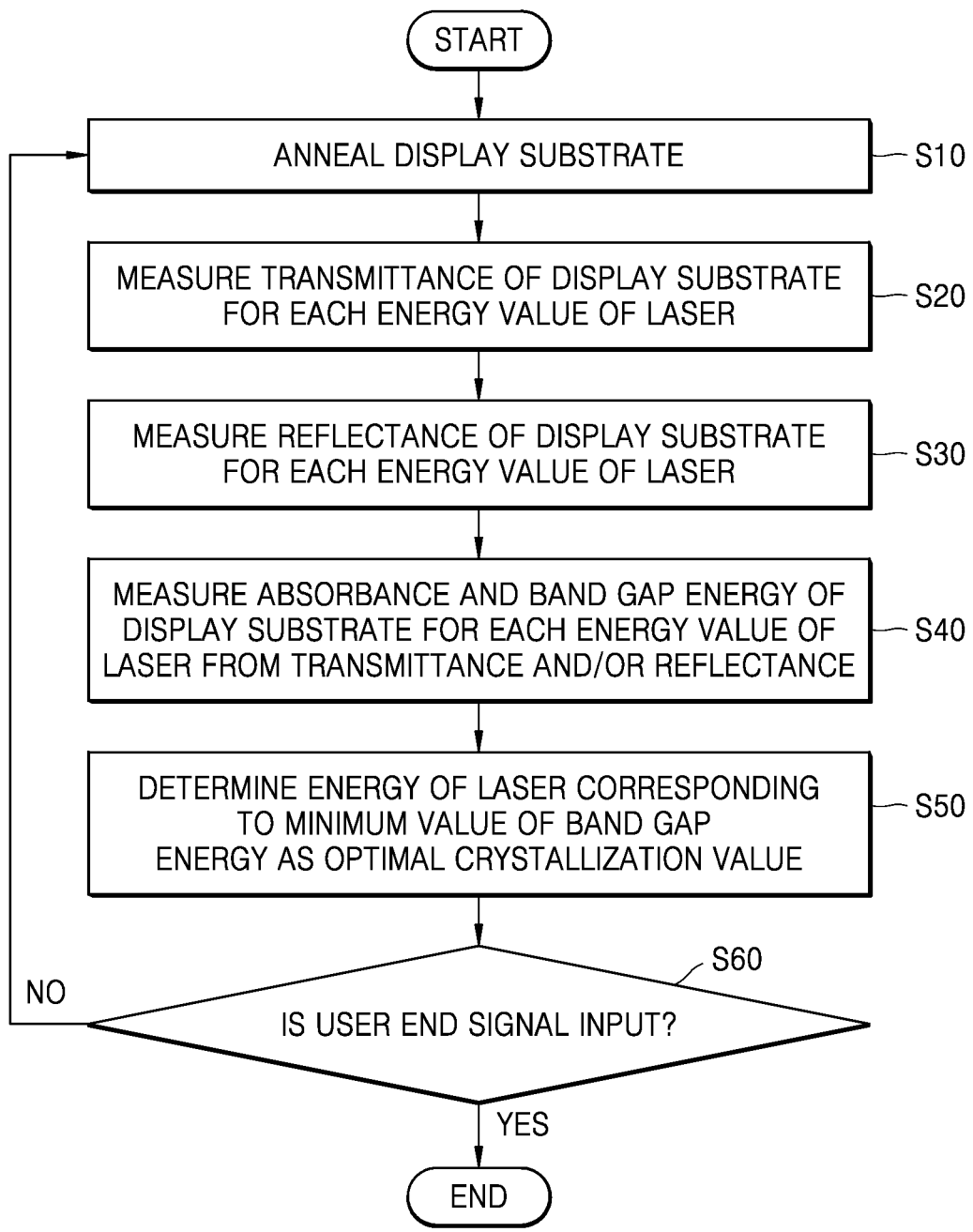
FIG. 5 is a flowchart illustrating a display device manufacturing method according to an embodiment.
Figure 6:
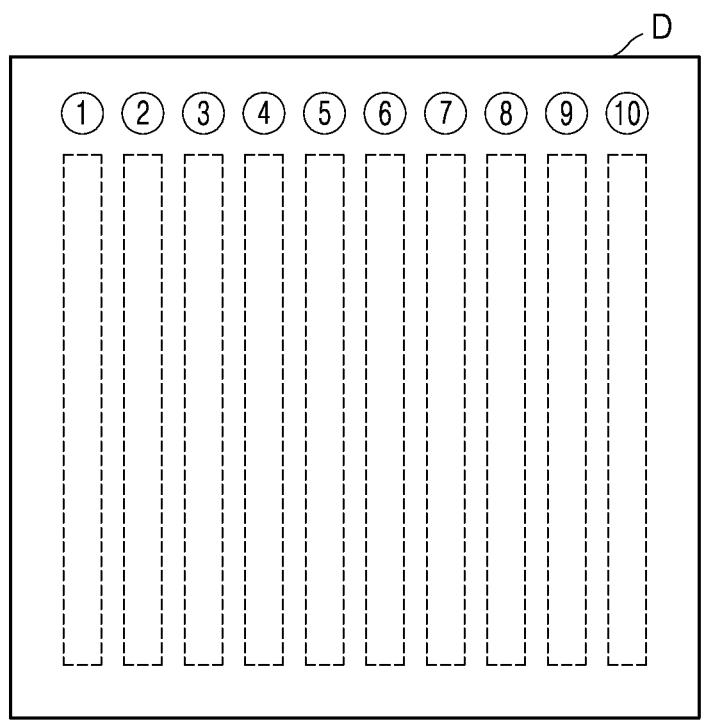
FIG. 6 is a schematic plan view illustrating a display substrate according to an embodiment.
Figure 7A:
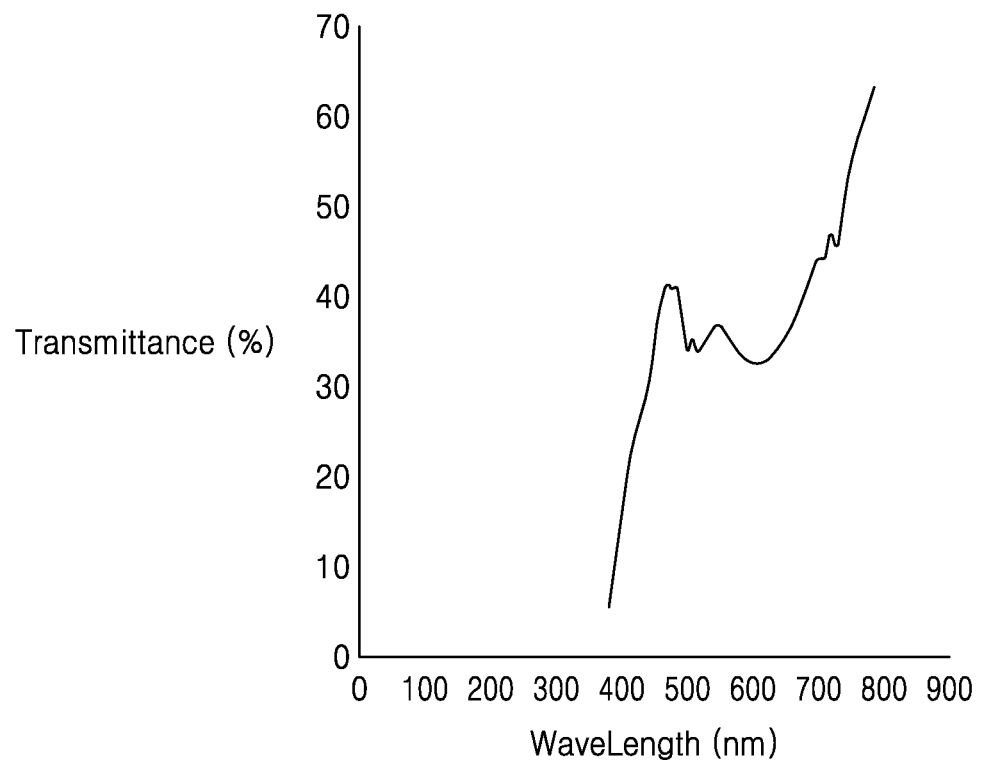
FIG. 7A is a graph illustrating an example of the transmittance measured by a display device manufacturing method according to an embodiment.
Figure 7B:
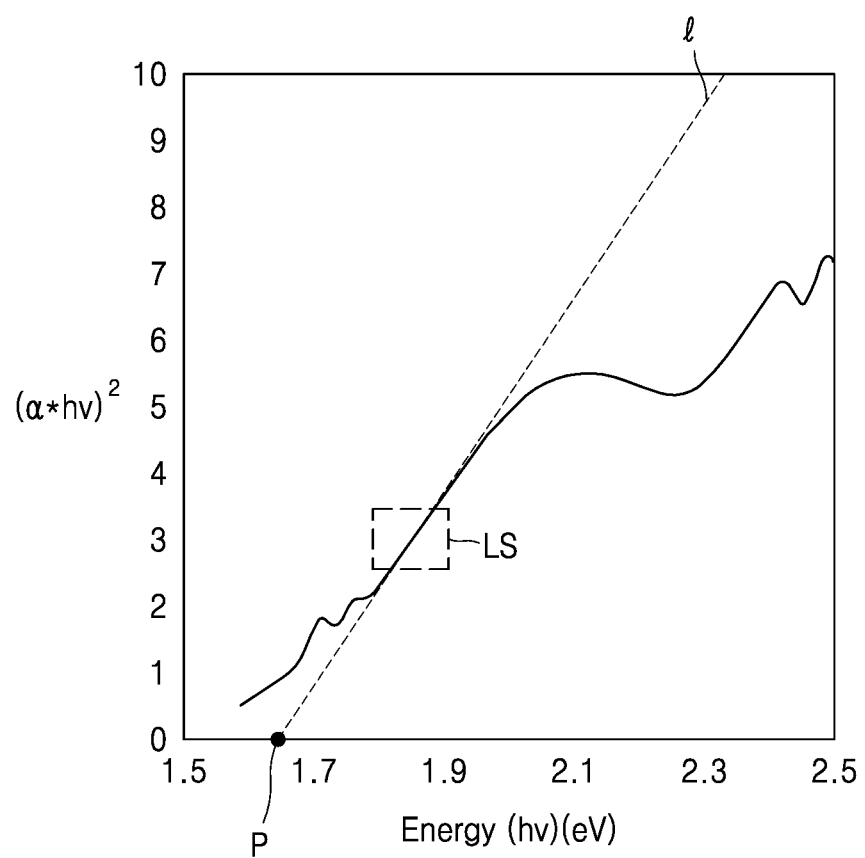
FIG. 7B illustrates a Tauc plot calculated by a display device manufacturing method according to an embodiment.

FIG. 5 is a flowchart schematically illustrating a display device manufacturing method according to an embodiment, and FIG. 6 is a plan view schematically illustrating a display substrate according to an embodiment. FIG. 7A is a graph illustrating an example of the transmittance measured by a display device manufacturing method according to an embodiment, and FIG. 7B illustrates a Tauc plot calculated by a display device manufacturing method according to an embodiment.

Referring to FIG. 5, first, a display substrate may be annealed by irradiating a laser to the display substrate (S10).

The display substrate may include an amorphous silicon thin film. The amorphous silicon thin film may be deposited by using chemical vapor deposition (CVD) such as catalyst CVD or plasma CVD. Annealing for crystallization of the amorphous silicon thin film may be performed by irradiating a laser to the amorphous silicon thin film. The crystallinity of a polycrystalline silicon thin film may vary according to the energy of the laser irradiated to the amorphous silicon thin film. The characteristics of the polycrystalline silicon thin film by crystallization may vary. The characteristics of a polycrystalline silicon thin film transistor formed of the polycrystalline silicon thin film may also vary.

According to an embodiment, the optimal laser energy value for manufacturing the polycrystalline silicon thin film may be determined by monitoring the crystallinity of the polycrystalline silicon thin film for each energy value of the laser.

Referring to FIG. 6, a display substrate may be divided into a plurality of areas. The display substrate may be divided into first to n-th areas. Here, "n" may be a natural number. The display substrate may be virtually divided into the plurality of areas by the control unit. As an example, the embodiments will be described for a case where the display substrate is divided into ten areas ① to ⑩ as illustrated in FIG. 6.

A laser having first to tenth energy values may be irradiated corresponding respectively to the first to tenth areas ① to ⑩ of the display substrate. By irradiating a laser having a plurality of energy values to one display substrate, the crystallinity of the display substrate for each energy value of the laser may be monitored at once. As another example, a laser having a plurality of energy values may be irradiated corresponding respectively to a plurality of display substrates.

The first to tenth energy values of the laser irradiated to the display substrate may satisfy an arithmetic progression, for example, from the first (lowest) to the tenth (highest) energy value. The laser energy may increase at certain or predetermined energy intervals from the first energy to the tenth energy. For example, the value of each of the first energy to the tenth energy may be greater by k than the value of the previous energy. The value of the tenth energy value may be greater by k than the value of the ninth energy value, and the value of the tenth energy value may be greater by 9k than the value of the first energy value. Here, "k" may be a rational number.

At the same time as the annealing of the display substrate, the transmittance of the annealed display substrate for each energy value of the laser may be measured by using the light emitter and the first measurer (S20). Referring to FIG. 7A, a graph illustrating an example of the transmittance measured by a display device manufacturing method according to an embodiment may be seen.

As described above, the display substrate may be divided into the first to tenth areas ① to ⑩, and the laser having the plurality of energy values may be sequentially irradiated corresponding respectively to the first to tenth areas ① to ⑩. First, the laser may be irradiated to the display substrate corresponding to the first area ① and the display substrate may be moved and then the laser may be irradiated to the display substrate corresponding to the second area ②. The transmittance of the display substrate corresponding to the first area ① may be measured while the laser is irradiated to the display substrate corresponding to each of the second area ② to the tenth area ⑩. The transmittance of the display substrate corresponding to each of the first to tenth areas ① to ⑩ may be sequentially measured while annealing the display substrate corresponding to each of the first to tenth areas ① to ⑩.

As another example, the annealing process of the display substrate and the measurement of the transmittance of the display substrate may be performed non-simultaneously. The transmittance of the display substrate may be measured after completion of the annealing process of the display substrate. For example, the transmittance of the display substrate corresponding to each of the first to tenth areas ① to ⑩ may be sequentially measured after completion of the operation of annealing the display substrate by irradiating the laser having the plurality of energy values corresponding respectively to the first to tenth areas ① to ⑩.

When the transmittance of the display substrate for each energy value of the laser is measured, the reflectance of the annealed display substrate may be measured by using the second measurer (S30). When both the transmittance and reflectance of the display substrate are measured, the absorbance of the display substrate may be more accurately calculated and the value of the band gap energy calculated from the absorbance may be more accurate.

A process of measuring the reflectance of the display substrate may be performed similarly to the process of measuring the transmittance of the display substrate. At the same time as the annealing of the display substrate, the reflectance of the display substrate for each energy value of the laser may be measured by using the light emitter and the second measurer. As another example, the annealing process of the display substrate and the measurement of the reflectance of the display substrate may be performed non-simultaneously. The process of measuring the reflectance of the display substrate may be optional or may be omitted.

After measuring the transmittance and/or reflectance, the band gap energy and the absorbance of the display substrate for each energy value of the laser may be calculated from the measured transmittance and/or reflectance (S40). Hereinafter, a method of calculating the band gap energy will be described with reference to FIGS. 7A and 7B.

FIG. 7A is a graph illustrating the transmittance depending on the wavelengths measured by using the first measurer. This may be a graph corresponding to one of the transmittances measured for each energy value of the laser. Because the light emitted from the light emitter may be transmitted through or absorbed by the annealed display substrate, the absorbance of the display substrate may be calculated based on the transmittance of the display substrate. The absorbance of the annealed display substrate for each energy value of the laser may be calculated based on a transmittance graph illustrated in FIG. 7A.

The Tauc plot of FIG. 7B may be represented based on the absorbance calculated from the transmittance graph of FIG. 7A. The band gap energy may be derived by analyzing the Tauc plot of FIG. 7B. In FIG. 7B, "α" may correspond to an absorption coefficient and "hv" may correspond to energy.

Referring to FIG. 7B, the Tauc plot may include a linear section LS and a curved section having an inflection point. The band gap energy of the display substrate may be derived from a point P where a straight line f extending from the linear section LS of the Tauc plot meets the energy (hv) axis. That is, the band gap energy of the display substrate may correspond to the point P where the straight line f extending from the linear section LS of the Tauc plot meets the energy (hv) axis.

The transmittance of the annealed display substrate for each energy value of the laser may be measured, and the absorbance of the annealed display substrate for each energy value of the laser may be calculated based on each transmittance. The Tauc plot may be represented from the calculated absorbance, and the band gap energy of the annealed display substrate for each energy value of the laser may be derived by analyzing the Tauc plot based on the absorbance.

When the reflectance of the display substrate for each energy value of the laser is measured, the absorbance of the display substrate for each energy value of the laser may be calculated through the transmittance and the reflectance and based on this, the band gap energy may be derived by representing and analyzing the Tauc plot.

FIGS. 8A and 8B are tables illustrating the band gap energy for each energy value of a laser calculated by a display device manufacturing method according to an embodiment. FIG. 8A is a table illustrating a process of determining a first optimal crystallization value, and FIG. 8B is a table illustrating a process of calculating a second optimal crystallization value based on the first optimal crystallization value.

Referring to FIG. 8A, a first band gap energy ($E_{g,\ a}$) of each of the first to tenth areas ① to ⑩ for each of the first laser energy values ($E_{l,\ a}$) may be found. A laser having the $(1\text{-}1)^{th}$ laser energy value ($E_{l,\ a}1$) may be irradiated to the first area ①, and the first area ① may be annealed. The band gap energy of the annealed first area ① may be the $(1\text{-}1)^{th}$ band gap energy ($E_{g,\ a}1$). Although the description has been made based on the first area ①, the second to tenth areas ② to ⑩ may be applied in the same way. A laser having the $(1\text{-}10)^{th}$ laser energy value of ($E_{l,\ a}10$) may be irradiated to the tenth area ⑩, and the tenth area ⑩ may be annealed. The band gap energy of the annealed tenth area ⑩ may be the $(1\text{-}10)^{th}$ band gap energy ($E_{g,\ a}10$).

In an embodiment, the $(1\text{-}1)^{th}$ laser energy value ($E_{l,\ a}1$) to the $(1\text{-}10)^{th}$ laser energy value ($E_{l,\ a}10$) may satisfy an arithmetic progression. The laser energy may increase by certain or predetermined energy intervals from the $(1\text{-}1)^{th}$ laser energy value ($E_{l,\ a}1$) to the $(1\text{-}10)^{th}$ laser energy value ($E_{l,\ a}10$). For example, each of the $(1\text{-}1)^{th}$ laser energy value ($E_{l,\ a}1$) to the $(1\text{-}10)^{th}$ laser energy value ($E_{l,\ a}10$) may be greater by k than the value of the previous laser energy value. For example, the value of the $(1\text{-}10)^{th}$ laser energy ($E_{l,\ a}10$) may be greater by 9k than the value of the $(1\text{-}1)^{th}$ laser energy ($E_{l,\ a}1$). Here, "k" may be a rational number.

The first laser energy value ($E_{l,\ a}$) corresponding to the minimum value among the first band gap energy ($E_{g,\ a}$) of each of the first to tenth areas ① to ⑩ for each of the first laser energy value ($E_{l,\ a}$) may be determined as the first optimal crystallization value (referring to S50).

The value of the band gap energy of the polycrystalline silicon thin film formed by annealing the amorphous silicon thin film may be about 1.1 eV to about 1.5 eV. The smaller the value of the band gap energy of the polysilicon thin film may be, the better the crystallinity of the polycrystalline silicon thin film may be. As described above, the crystallinity of the polycrystalline silicon thin film may vary according to the energy value of the laser irradiated to the amorphous silicon thin film. The band gap energy of the polycrystalline silicon thin film may vary according to the energy value of the laser irradiated to the amorphous silicon thin film. The energy value of the laser at which the band gap energy of the polycrystalline silicon thin film is minimal may be selected, and the selected energy value of the laser may be the optimal laser energy for manufacturing the polycrystalline silicon thin film.

For example, as illustrated in FIG. 8A, among the first band gap energy ($E_{g,\ a}$) of each of the areas ① to ⑩, the $(1\text{-}9)^{th}$ band gap energy ($E_{g,\ a}9$) of the area (may be the minimum. The $(1-9)^{th}$ laser energy value ($E_{l,\,a}9$) corresponding to the $(1-9)^{th}$ band gap energy ($E_{g,\,a}9$) may be determined as the first optimal crystallization value.

The process of S10 to S50 may be performed periodically. For example, the laser irradiated to the surface of the display substrate may be an excimer laser, and the process of S10 to S50 may be performed whenever a gas generating the excimer laser is exhausted and a new gas is injected or changed. Whenever a gas generating the excimer laser is exhausted and a new gas is injected or changed, the optimal crystallization value according to the process of S10 to S50 may be calculated or determined.

The process of S10 to S50 may be ended or may be performed again depending on whether a user end signal is input (S60). After the first optimal crystallization value is determined according to the process of S10 to S50, an operation of determining the second optimal crystallization value may be performed or may not be performed depending on whether a user end signal is input.

FIG. 8B illustrates a process of determining the second optimal crystallization value according to the process of S10 to S50 when a user end signal is not input. Referring to FIG. 8B, second band gap energy ($E_{g,\,b}$) of each of the first to tenth areas ① to ⑩ for each of the second laser energy values ($E_{l,\,b}$) may be represented. A laser having a $(2-1)^{th}$ laser energy value ($E_{l,\,b}1$) may be irradiated to the first area ①, and the first area ① may be annealed. The band gap energy of the annealed first area ① may be the $(2-1)^{th}$ band gap energy ($E_{g,\,b}1$). Although the description has been made based on the first area ①, the second to tenth areas ② to ⑩ may be applied in the same way. A laser having the $(2-10)^{th}$ laser energy value ($E_{l,\,b}10$) may be irradiated to the tenth area (⑩), and the tenth area ⑩ may be annealed. The band gap energy of the annealed tenth area ⑩ may be the $(2-10)^{th}$ band gap energy ($E_{g,\,b}10$). The display substrate divided into the virtual first to tenth areas ① to ⑩ may be different from the display substrate used to calculate the first optimal crystallization value.

In an embodiment, a median value of the second laser energy values ($E_{l,\,b}$) may be equal to the first optimal crystallization value. The median value of the laser energy values from the $(2-1)^{th}$ laser energy value ($E_{l,\,b}1$) to the $(2-10)^{th}$ laser energy value ($E_{l,\,b}10$) may be equal to the first optimal crystallization value.

As illustrated in FIG. 8B, the median value from the $(2-1)^{th}$ laser energy value ($E_{l,\,b}1$) to the $(2-10)^{th}$ laser energy ($E_{l,\,b}10$) may be the $(2-5)^{th}$ laser energy value ($E_{l,\,b}5$) or $(2-6)^{th}$ laser energy value ($E_{l,\,b}6$). The $(2-5)^{th}$ laser energy value ($E_{l,\,b}5$) or the $(2-6)^{th}$ laser energy value ($E_{l,\,b}6$) may be equal to the first optimal crystallization value. That is, the value of the $(2-5)^{th}$ laser energy ($E_{l,\,b}5$) or the value of the $(2-6)^{th}$ laser energy ($E_{l,\,b}6$) may be equal to the value of the $(1-9)^{th}$ laser energy ($E_{l,\,a}9$).

In an embodiment, the $(2-1)^{th}$ laser energy value ($E_{l,\,b}1$) to the $(2-10)^{th}$ laser energy value ($E_{l,\,b}10$) may satisfy an arithmetic progression. The laser energy may increase by certain or predetermined energy intervals from the $(2-1)^{th}$ laser energy value ($E_{l,\,b}1$) to the $(2-10)^{th}$ laser energy value ($E_{l,\,b}10$). For example, the laser energy values from ($E_{l,\,b}1$) to ($E_{l,\,b}10$) may be greater by k than the value of the previous laser energy value. Thus, the value of the $(2-10)^{th}$ laser energy ($E_{l,\,b}10$) may be greater by 9k than the value of the $(2-1)^{th}$ laser energy ($E_{l,\,b}1$). Here, "k" may be a rational number.

In case that the $(2-6)^{th}$ laser energy value ($E_{l,\,b}6$) is equal to the value of the $(1-9)^{th}$ laser energy ($E_{l,\,a}9$), the first optimal crystallization value, the laser energy values may decrease by certain or predetermined energy intervals from the $(2-6)^{th}$ laser energy value ($E_{l,\,b}6$) to the $(2-1)^{th}$ laser energy value ($E_{l,\,b}1$), and the laser energy may increase by certain or predetermined energy intervals from the $(2-6)^{th}$ laser energy value ($E_{l,\,b}6$) to the $(2-10)^{th}$ laser energy value ($E_{l,\,b}10$). For example, the value of the $(2-1)^{th}$ laser energy ($E_{l,\,b}1$) may be smaller by 5k than the value of the $(2-6)^{th}$ laser energy ($E_{l,\,b}6$), and the value of the $(2-3)^{th}$ laser energy ($E_{l,\,b}3$) may be smaller by 3k than the value of the $(2-6)^{th}$ laser energy ($E_{l,\,b}6$). Also, the value of the $(2-10)^{th}$ laser energy ($E_{l,\,b}10$) may be greater by 4k than the value of the $(2-6)^{th}$ laser energy ($E_{l,\,b}6$), and the value of the $(2-8)^{th}$ laser energy ($E_{l,\,b}8$) may be greater by 2k than the value of the $(2-6)^{th}$ laser energy ($E_{l,\,b}6$).

The second laser energy value ($E_{l,\,b}$) corresponding to the minimum value among the second band gap energy values ($E_{g,\,b}$) of each of the first to tenth areas ① to ⑩ for each of the second laser energy ($E_{l,\,b}$) may be determined as the second optimal crystallization value (S50).

In the display device manufacturing method according to an embodiment, the transmittance and/or the reflectance may be measured and the absorbance may be calculated based on the measurements. A Tauc plot may be represented based on the calculated absorbance, and the band gap energy of the display substrate may be derived by analyzing the Tauc plot. This process may be performed for each laser energy. The energy of the laser corresponding to the minimum value of the band gap energy may be determined as the optimal crystallization value by comparing the band gap energy derived for each laser energy value. The process of determining the optimal crystallization value may be performed while the display substrate is annealed, a crystallinity inspection time may be reduced. Because it is analyzed by a numerical value of the band gap energy instead of by human visual inspection, variations in quality caused by a visual inspection may be reduced.

As described above, a display device manufacturing apparatus and method may shorten inspection time and reduce variations of quality due to visual inspection by inspecting the crystallinity of an annealed silicon thin film in real time after annealing an amorphous silicon thin film. However, the disclosure is not limited by such effects.

Although the embodiments have been described, it is understood that the invention should not be limited to these embodiments but various changes and modifications can be made by one ordinary skilled in the art within the spirit and scope of the invention as hereinafter claimed. Hence, the real protective scope of the invention shall be determined by the technical scope of the accompanying claims.

What is claimed is:

1. A display device manufacturing method comprising:
   annealing a display substrate by irradiating a laser to the display substrate in different energy values;
   measuring a transmittance of the annealed display substrate; and
   determining an optimal crystallization value of the display substrate based on the transmittance,
   wherein the annealing of the display substrate comprises:
   dividing the display substrate into a plurality of areas; and
   irradiating the laser having different energy values corresponding to the plurality of areas, respectively, of the display substrate,
   wherein the determining of the optimal crystallization value comprises:
   calculating an absorbance of the annealed display substrate for each energy value of the laser based on the transmittance;

calculating a band gap energy of the annealed display substrate for each energy value of the laser based on the absorbance; and determining an energy value of the laser corresponding to a minimum value of the band gap energy as the optimal crystallization value.

2. The display device manufacturing method of claim 1, wherein the annealing of the display substrate and the measuring of the transmittance are simultaneously performed.

3. The display device manufacturing method of claim 1, wherein the annealing of the display substrate comprises irradiating the laser having the different energy values corresponding to a plurality of areas, respectively, of the display substrate.

4. The display device manufacturing method of claim 3, wherein the energy values of the laser satisfy an arithmetic progression from a lowest energy value to a highest energy value.

5. The display device manufacturing method of claim 3, wherein the measuring of the transmittance comprises measuring transmittances of the plurality of areas of the display substrate.

6. The display device manufacturing method of claim 1, further comprising measuring a reflectance of the annealed display substrate.

7. The display device manufacturing method of claim 6, wherein the calculating of the absorbance comprises calculating an absorbance for each energy value of the laser based on the transmittance and the reflectance.

8. The display device manufacturing method of claim 1, wherein the calculating of the band gap energy is performed by using a Tauc plot based upon the absorbance.

9. The display device manufacturing method of claim 8, wherein the band gap energy corresponds to a point where a straight line extending from a linear section of the Tauc plot meets an energy axis.

10. The display device manufacturing method of claim 1, wherein a median value of the energy values of the laser is equal to the optimal crystallization value.

11. The display device manufacturing method of claim 10, wherein a part of the energy values of the laser decrease by predetermined energy intervals from the median value, and another part of the energy values of the laser increase by predetermined energy intervals from the median value.

12. The display device manufacturing method of claim 1, further comprising moving the display substrate.

13. The display device manufacturing method of claim 12, wherein the annealing of the display substrate and the measuring of the transmittance are sequentially performed while the display substrate moves.

14. The display device manufacturing method of claim 1, wherein:

the transmittance is measured at a wavelength including ultraviolet light;

the absorbance is calculated based on the transmittance at the wavelength including ultraviolet light.

* * * * *